United States Patent [19]
Nichols

[11] Patent Number: 5,563,772
[45] Date of Patent: Oct. 8, 1996

[54] RIGIDIZED OUTER SUPPORT STRUCTURE FOR AN INTEGRATED CIRCUIT CARD

[75] Inventor: Jeffreys R. Nichols, San Jose, Calif.

[73] Assignee: Wireless Access, Santa Clara, Calif.

[21] Appl. No.: 453,746

[22] Filed: May 30, 1995

Related U.S. Application Data

[62] Division of Ser. No. 352,384, Dec. 8, 1994, which is a continuation of Ser. No. 114,656, Aug. 31, 1993, abandoned.

[51] Int. Cl.$^6$ ........................................ H05K 5/00
[52] U.S. Cl. .................. 361/752; 361/796; 361/785; 361/807; 174/17 R
[58] Field of Search ........................ 361/744, 752, 361/759, 796, 785, 801, 807; 174/17 R, 52.4, 261; 439/59

[56] References Cited

U.S. PATENT DOCUMENTS

| | | |
|---|---|---|
| 3,952,937 | 4/1976 | Lamons et al. . |
| 3,998,505 | 12/1976 | Frost et al. . |
| 4,011,961 | 3/1977 | Widen et al. . |
| 4,410,383 | 10/1983 | Lipari . |
| 4,554,418 | 11/1985 | Toy ............................ 179/2 DP |
| 4,739,345 | 4/1988 | Namba et al. . |
| 4,750,075 | 6/1988 | Oishi . |
| 4,970,610 | 12/1990 | Knappe . |
| 4,970,618 | 11/1990 | Kato et al. . |
| 5,075,962 | 12/1991 | Gibson ............................ 29/827 |
| 5,107,404 | 4/1992 | Tam ............................ 361/424 |
| 5,121,295 | 6/1992 | Lam ............................ 361/395 |
| 5,163,327 | 11/1992 | Papai . |
| 5,199,593 | 4/1993 | Kita . |
| 5,288,350 | 2/1994 | Kita . |

FOREIGN PATENT DOCUMENTS

| | | | |
|---|---|---|---|
| 0412232 | 2/1991 | European Pat. Off. | G06F 9/46 |
| 9015394 | 12/1990 | WIPO | G60F 15/46 |
| 9103017 | 3/1991 | WIPO | G06K 13/00 |

OTHER PUBLICATIONS

IBM Technical Disclosure Bulletin, "Ultrasonically Welded Diskette Cartridge", Rose, et al., vol. 26, No. 9, Feb. 1984, pp. 4656–4657.

*Primary Examiner*—Leo P. Picard
*Assistant Examiner*—Y. Whang
*Attorney, Agent, or Firm*—Blakely, Sokoloff, Taylor & Zafman

[57] ABSTRACT

A integrated circuit card having a rigidized frame to surround the electronic devices on a printed circuit (PC) board. The card includes a frame and integral cover for the top and bottom. The top and bottom are constructed out of a material that does not interfere with the use of an antenna coupled to the board assembly within the card. The bottom and top are coupled together using pins. When the two are coupled together the frame is better supported.

14 Claims, 9 Drawing Sheets

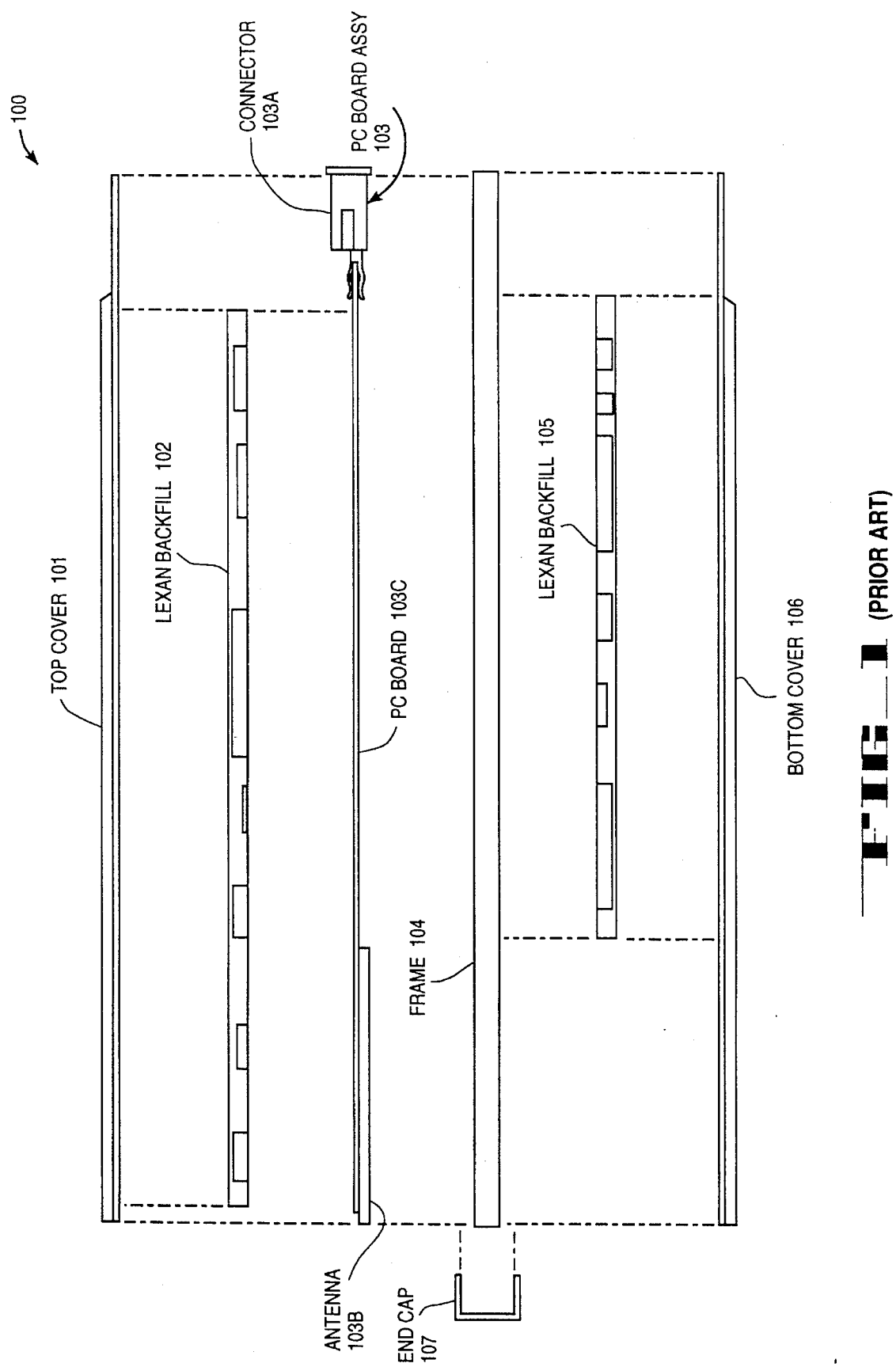
FIG_1 (PRIOR ART)

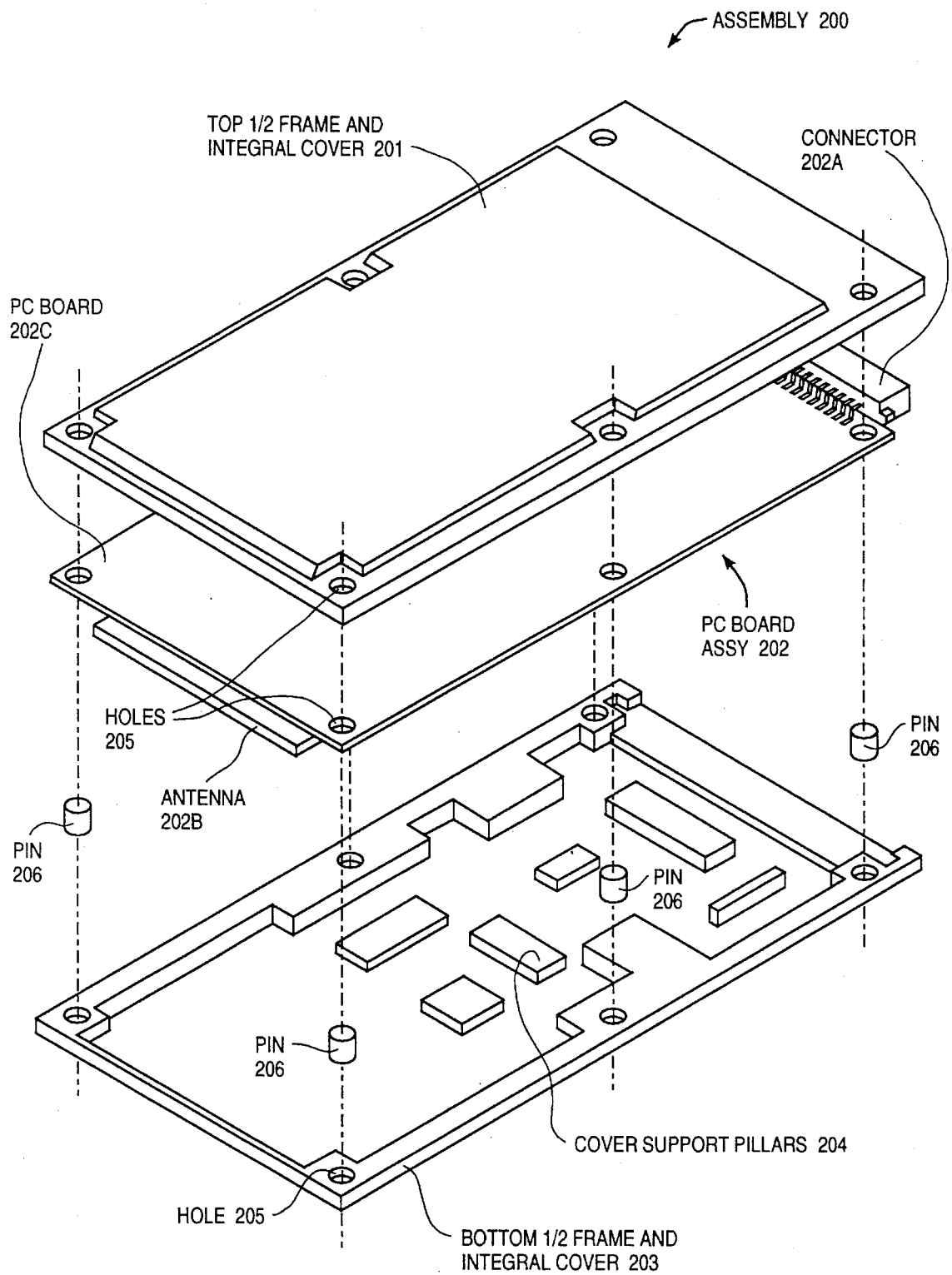
FIG_2A

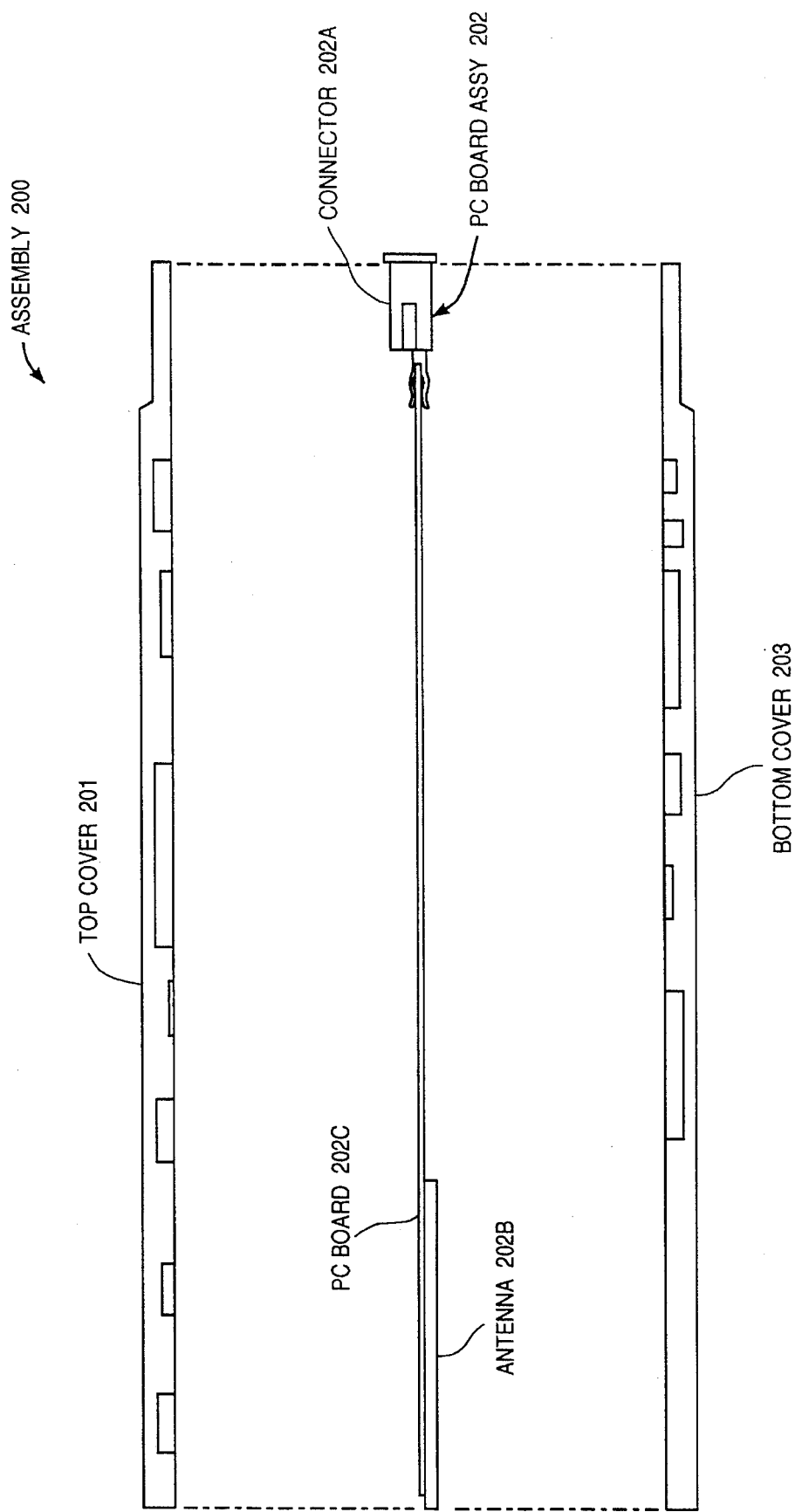
FIG._2B

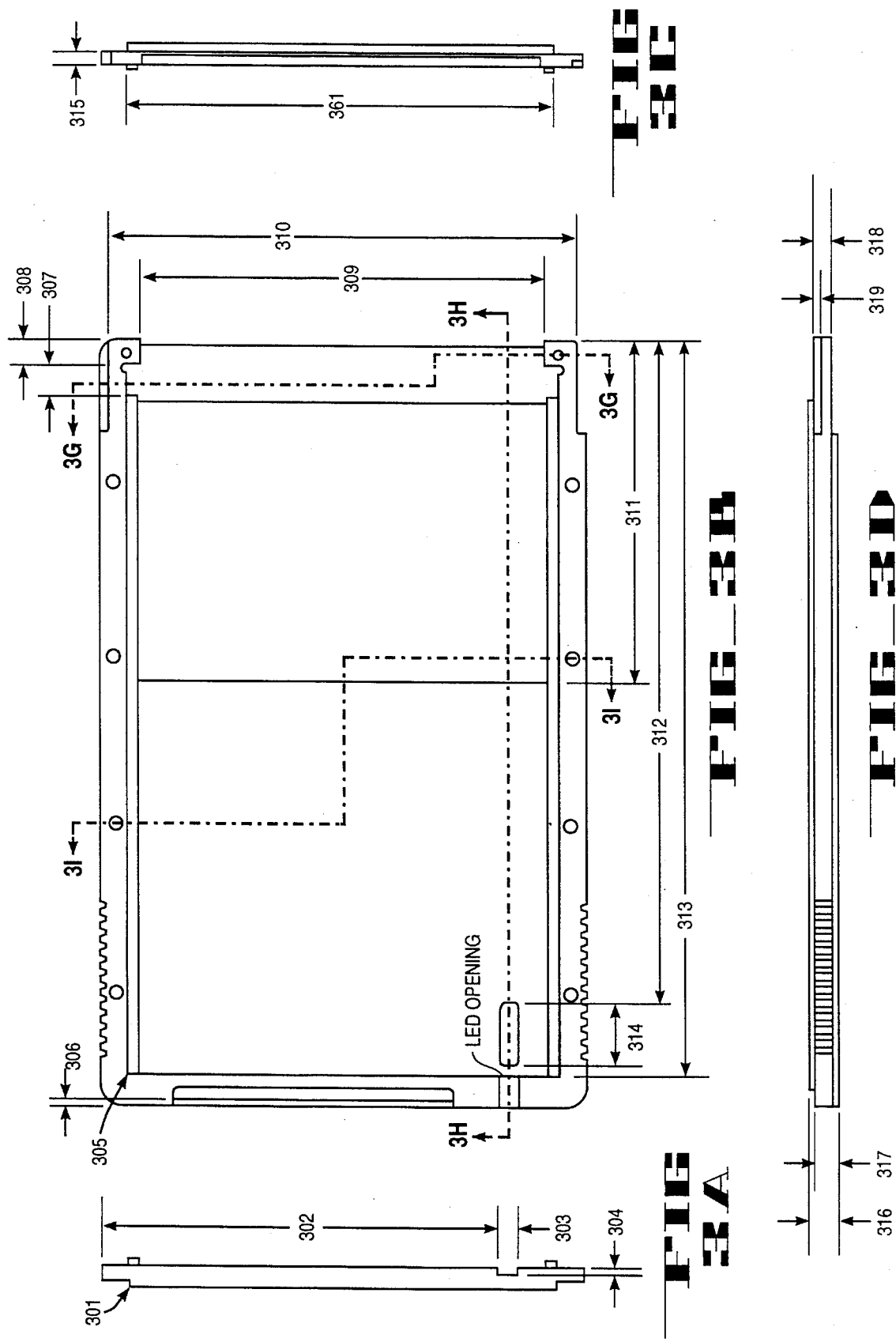

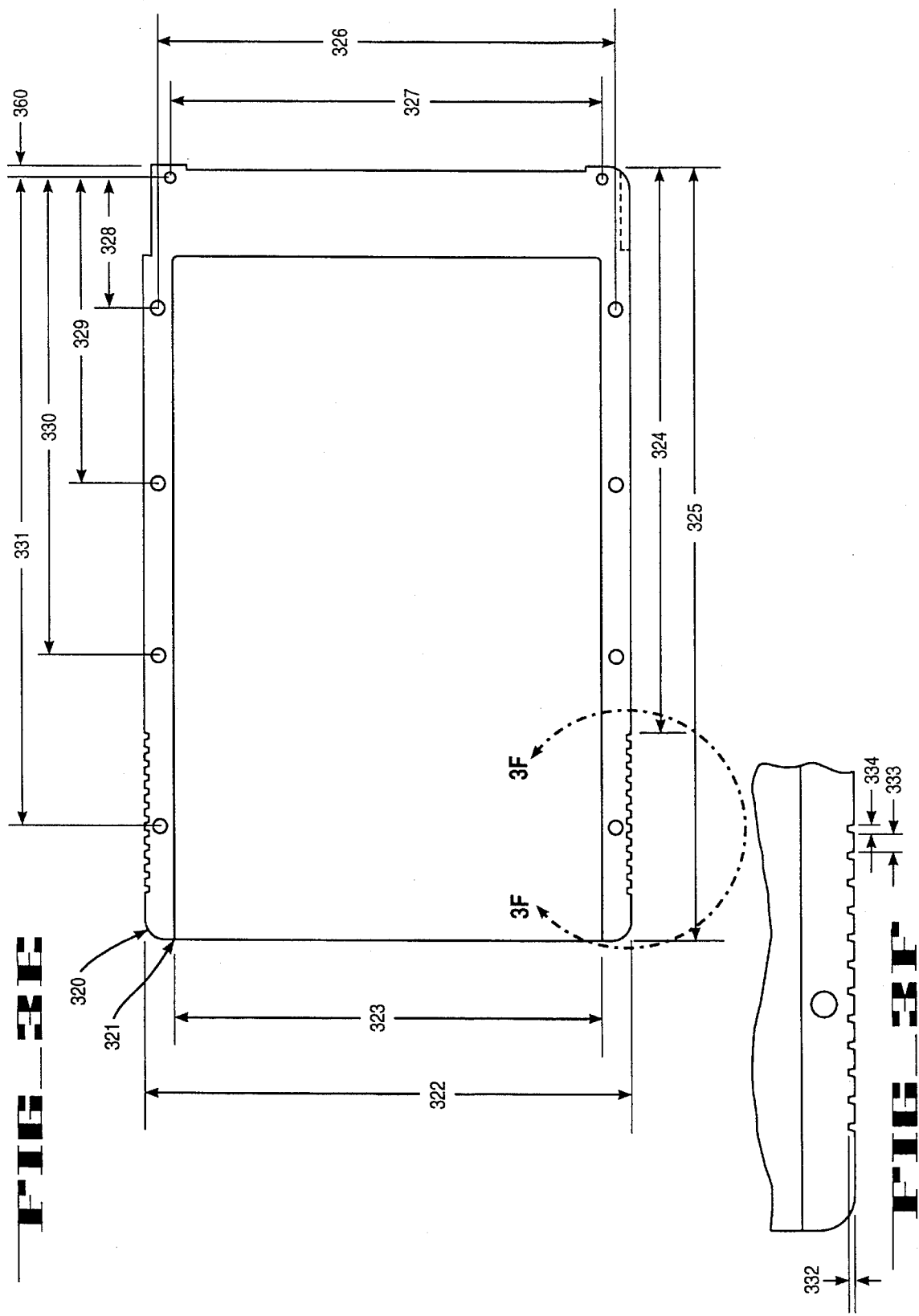

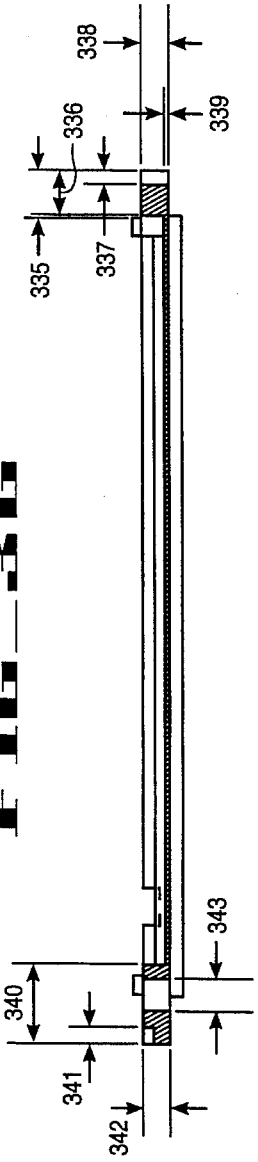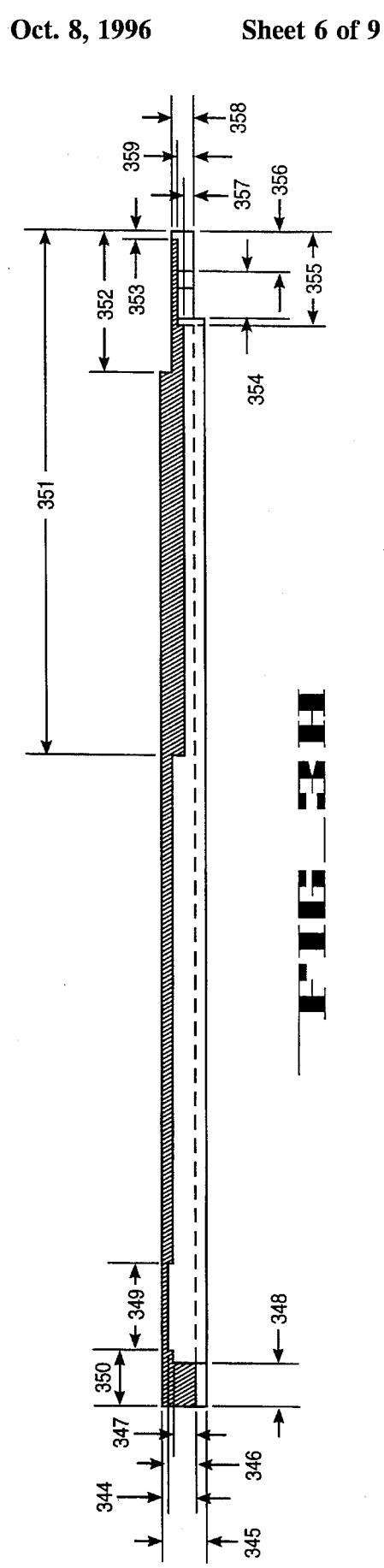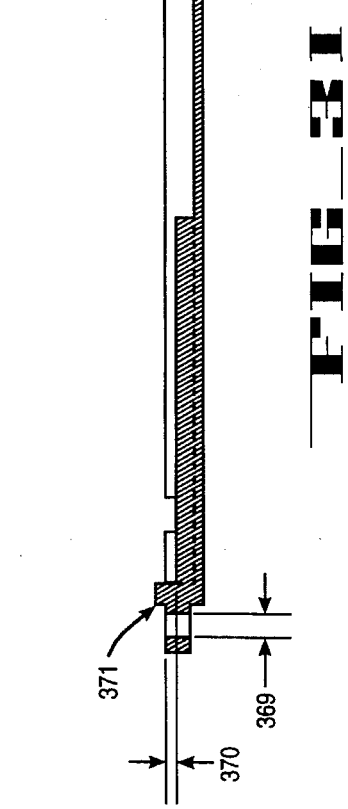

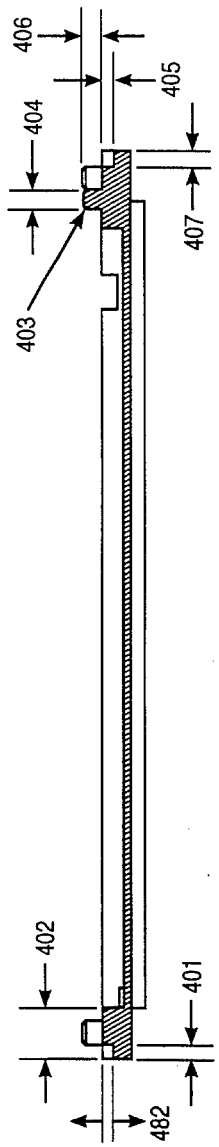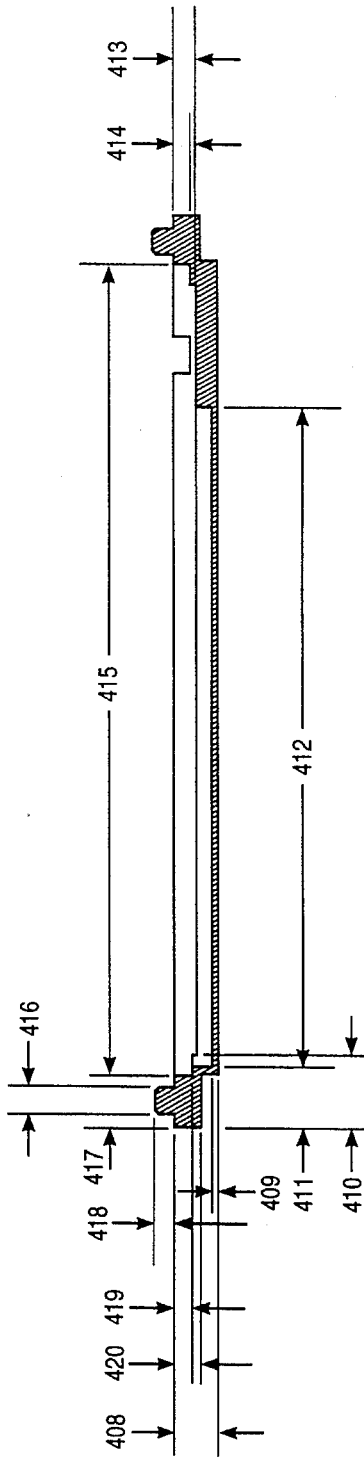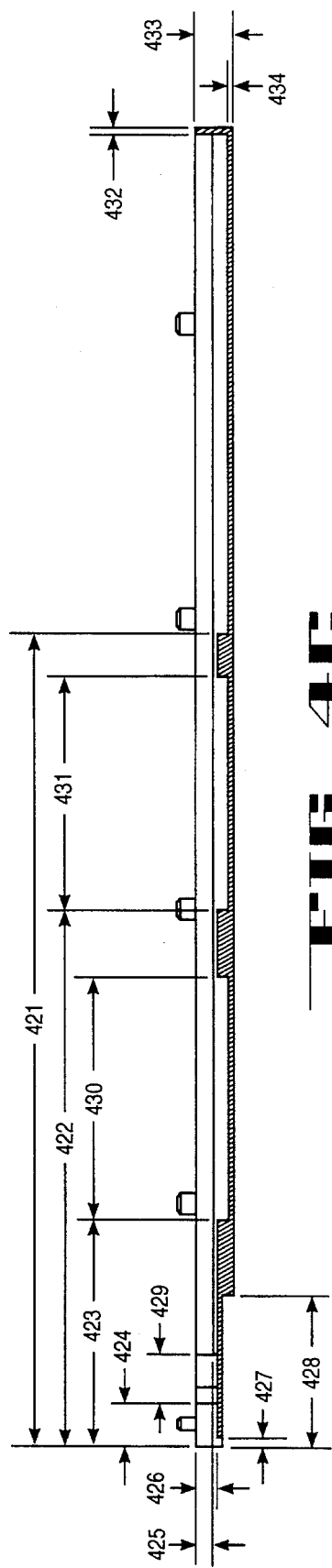

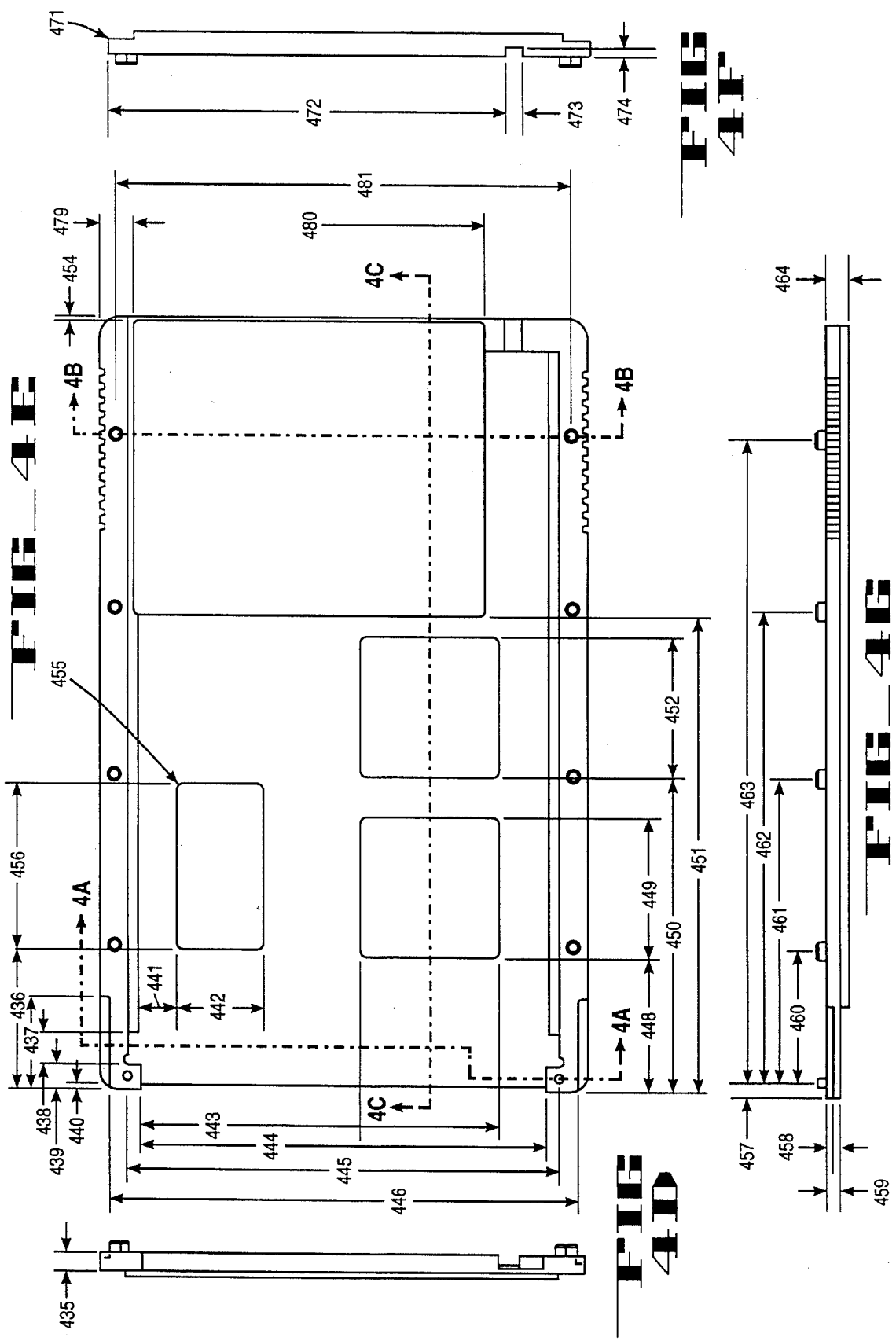

RIGIDIZED OUTER SUPPORT STRUCTURE FOR AN INTEGRATED CIRCUIT CARD

This is a divisional of application Ser. No. 08/352,384, filed Dec. 8, 1994, which is a continuation of application Ser. No. 08/119,656, filed Aug. 31, 1993 abandoned.

FIELD OF THE INVENTION

The present invention relates to the field of integrated circuit cards; particularly, the present invention relates to a rigidized outer frame for credit-card sized integrated circuit cards.

BACKGROUND OF THE INVENTION

Today, one of the most rapidly growing markets for computer systems is the portable computer market. Recently, portable computers have become more powerful, while also becoming smaller and lighter. Furthermore, as a part of this changing market, various computer components have become smaller and lighter while their ability to handle more data has increased.

One group of devices which is especially important to portable computers is peripheral input/output devices such as paging receivers, modems, facsimile machines, or local area networks (LANs). A paging receiver, for example, allows a user of a portable computer to receive messages that are broadcast over wide areas. The paging receiver receives paging messages through an antenna and generally stores the paging messages on board for retrieval through the computer system. The reduction in size of paging receivers occurred at the same time as the reduction in size of other components, such as hard disks.

Typically, electronics for computer, such as that of the paging receiver, are arranged on an internal board within the computer. Some arrangements provide separate portable electronics which will be carried along and attached to a portable computer when needed. Furthermore, some electronics, paging receivers in particular, have been designed recently to plug into sockets recessed within the body of a portable computer. Various forms of computer components may be plugged into the same socket of a computer, thereby reducing the space required within the portable computer. For example, an international standard which defines the physical and electrical interface specifications for the interchangeability of memory and input/output cards was introduced by Personal Computer Memory Card Internationally Association (PCMCIA) concurrently with the Japanese Electrical Industry Association (JEIDA) in September of 1991. These cards are often referred to as integrated circuit (IC) cards.

The PCMCIA specification provides its personal computer cards be a specific size (with respect to its outer dimensions) and to include a 68-pin connector located at the end of the card for the sending and receiving of signals between the card and the computer system.

A side-section view of the standard assembly for a PCMCIA card is shown in FIG. 1. Referring to FIG. 1, PCMCIA card 100 is shown with top cover 101, backfill 102, printed circuit (PC) board assembly 103, frame 104, backfill 105, bottom cover 106 and end cap 107. Top cover 101, bottom cover 106 and frame 104 provide the outer protective structure of PCMCIA card 100. Top cover 101, bottom cover 106 and frame 104 act to protect the components on PC board assembly 103. Frame 104 supports PC board assembly 103 while top cover 101 and bottom cover 106 enclose the remainder of card 100. Top cover 101 and bottom cover 106 are typically comprised of stainless steel. Frame 104 is usually made out of plastic.

PC board assembly 103 contains the electronic and integrated circuit components used to provide the functionality of PCMCIA card 100. For instance, the components on PC board assembly 103 may allow PCMCIA card 100 to act as a paging receiver, a modem, a LAN access or one or more of a variety of other functions. In one embodiment, PC board assembly 103 includes a mating connector 103A for interfacing with the computer system (e.g., notebook or laptop computer system). PC board assembly 103 also includes PC board 103C which couples the electronic components in board assembly 103 together. If PC board assembly 103 is to act as a paging receiver, an antenna 103B may also be coupled to PC board 103C to receive paging messages. End cap 107 holds the entire structure together by sliding over the ends of top cover 101 and bottom cover 103 when they are in contact with frame 104.

One problem with prior art PCMCIA card assemblies is that they did not adequately protect the circuit components on PC board assembly 103. Because the size (i.e., thickness) requirements of the card and the size of the circuit components, the metal used for top cover 101 and bottom cover 106 is usually thin. Since the metal is thin, it is easy to depress top cover 101 and bottom cover 106 into the card and damage the circuit components when handling the card. One prior art solution to this problem was to provide backfill 102 and backfill 105 to the standard assembly of PCMCIA card 100, as shown in FIG. 1. Backfills 102 and 103 are typically lexan plastic sections designed to provide added support and protection to the components on PC board assembly 103 by preventing top cover 101 and bottom cover 106 from being depressed into the card interior. One problem of using backfill 102 and backfill 105 is that the plastic must be molded to the specific configuration of the components on PC board assembly 103. Therefore, if changes are made to the components on PC board assembly 103, backfill 102 and backfill 105 may have to be redesigned. The redesign may require producing another mold by which the plastic backfills 102 and 105 are made. It is desirable to produce the PCMCIA card which protects the circuit components on the PC board assembly 103 without having to use backfill sections. Moreover, it is desirable to produce a outer support structure for PCMCIA card 101 that can be used for all types of circuit component arrangements on PC board assembly 103, such that any change in the circuit board assembly does not result in changes to the outer support structure.

One possible solution to strengthening the outer structure is to utilize a thicker metal structure for top cover 101, bottom cover 106 and frame 104. On one hand, the thickness of the metal is limited by the requirement of the PCMCIA standard that the cards be of a certain thickness. Furthermore, in certain applications, PCMCIA card 100 cannot utilize a metal outer structure. For instance, if PCMCIA card 100 is designed to be a paging receiver, an antenna is required for receiving paging messages. This antenna would be located within PCMCIA card 100. A metal outer structure would interfere with the antenna's ability to receive the paging messages. Therefore, a metal outer structure cannot be used for all applications of PCMCIA cards. Therefore, it is desirable to strengthen the outer structure without having to use a metal or conductive outer structure.

Another problem associated with the PCMCIA cards that utilize backfill components 102 and 105 is the added cost that is required. Prior art PCMCIA cards using backfill can cost around $4.00/piece to produce. This cost is generally considered high when compared to the cost of the circuit components on PC board assembly 103. It is desirable to produce a PCMCIA outer protection structure which is less expensive than the prior art.

The present invention provides an assembly configuration for a PCMCIA card. The present invention provides an outer support that protects the components on the PC board assembly while not requiring backfill components in the assembly. Furthermore, the present invention provides an outer support structure for a PCMCIA card that does not interfere with an on-board antenna. Furthermore, the present invention provides an assembly for PCMCIA card that may be produced at a lower cost than prior art PCMCIA cards.

SUMMARY OF THE INVENTION

An integrated circuit (IC) card for use in a computer system is described. The IC card of the present invention includes a top cover and integral frame and a bottom cover and integral frame. The IC card includes a board assembly that contains electronic devices that operate together to provide a specific function, such as that of a paging receiver, modem, LAN, etc. The board assembly includes a coupling mechanism for coupling the PC board to the computer system so that signals may be transferred signals between the computer system and the electronic devices. The top cover/frame, the bottom cover/frame and the board assembly are all coupled, such that a frame is formed around the board assembly and the board assembly is contained within the frame and two covers with the coupling mechanism exposed outside of the IC card.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

FIG. 1 illustrates a side-section view of a prior art assembly for a PCMCIA integrated circuit card.

FIG. 2A illustrates one embodiment of the integrated circuit card assembly of the present invention.

FIG. 2B illustrates a side-section view of one embodiment of an integrated circuit card of the present invention.

FIG. 3A–3I illustrate multiple views of one embodiment of the top cover/frame of the integrated circuit card of the present invention.

FIG. 4A–4I illustrate multiple views of one embodiment of the bottom cover/frame of the integrated circuit card of the present invention.

DETAILED DESCRIPTION OF THE PRESENT INVENTION

Figure 4I:
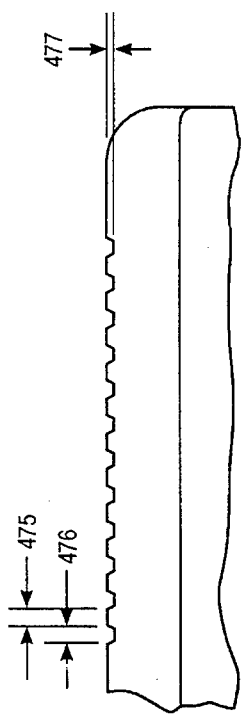

A credit-card sized integrated circuit card is described. In the following detailed description of the present invention numerous specific details are set forth, such as specific dimensions, numbers of support pillars, number of holes, etc., in order to provide a thorough understanding of the present invention. However, it will be obvious to one skilled in the art that the present invention may be practiced without these specific details. In other instances, well-known structures and devices are shown in block diagram form, rather than in detail, in order to avoid unnecessarily obscuring the present invention.

Overview of the Present Invention

The present invention provides a card architecture for a credit-card sized integrated circuit (IC) card. In one embodiment, the integrated circuit card assembly is for a PCMCIA card. The present invention may be used for other types of integrated circuit cards that may be inserted in a slot in the side of the computer system for its use.

FIGS. 2A and 2B illustrate the integrated circuit card assembly of the present invention. The IC card architecture shown in FIGS. 2A and 2B adhere to the PCMCIA standard. However, the card architecture of the present invention is not limited to being a PCMCIA card and may be applied to other types of card architecture standards, or even non-standards.

FIG. 2A depicts a perspective view of the integrated circuit card assembly of the present invention. Referring to FIG. 2A, assembly 200 comprises a top 201, PC board assembly 202 and bottom 203. Each of top 201 and bottom 203 includes one-half of the frame and an integral cover as one part. Top 201 and bottom 203 do not have to include half of the frame. The actual percentage that each may include is variable. For instance, top 201 may include three-quarters of the frame while bottom 203 only includes one-quarter of the frame. In another embodiment, top 201 may include one-third of the frame while bottom 203 includes two-thirds of the frame. The only limitation is that the combination of top 201 and bottom 203 provides the entire frame.

Top 201 and bottom 203 form the outer support structure for assembly 200. In one embodiment, top 201 and bottom 203 are comprised of a hard molded plastic material, such as glass filled polycarbonate or other glass-filled plastic material. In one embodiment, the glass filled polycarbonate structure may be 20% glass. The material may be riton. Top 201 and bottom 203 may be produced by thermal extrusion (injection molding), injection compression, or any other plastic molding process.

Top 201 and bottom 203 may include cover support pillars, such as cover support pillars 204 shown and integrated into bottom 203. Cover support pillars 204 may be located in both top 201 and bottom 203 and protrude from the inner portion of top 201 and bottom 203, such that they surround the electronic and integrated circuit components on PC board assembly 202 when the card is assembled. In this manner, cover support pillars 204 provide additional support for assembly 200, such that depression of top 201 and bottom 203 into the interior of the card cannot occur. In this manner, the electronic components and integrated circuits on PC board assembly 202 are protected from damage due to pressure on the outer support structure of the card.

Cover support pillars 204 may be of a variety of sizes and shapes. Cover support pillars 204 may include pillars which run across the length of the card, across the width of the card, or from one side of top 201 and bottom 203 to the other. Cover support pillars 204 are a part of top 201 and bottom 203 in that they are integrated and molded into the material for top 201 and bottom 203 respectively. In one embodiment, cover support pillars 204 are molded in the same piece as top 201 and/or bottom 203. In FIG. 2A, cover support pillars 204 are only integrated into bottom 203.

PC board assembly 202 includes connector 202A, antenna 202B, and PC board 202C. Connector 202A is a pin receptive mating connector. In one embodiment, connector 202A is a 68 pin connector adhering to the PCMCIA standard. Connector 202A may also be an interface other than that of the PCMCIA standard responsible for providing a path for signals propagating between PC board assembly 202 and the remainder of the computer system. One end of each top 201 and bottom 203 are designed such that connector 202A is exposed when assembly 200 is assembled. PC board 202C contains the integrated circuit components for the IC card. In one embodiment, the IC card is a paging radio receiver. In this case, PC board assembly 202 includes electronic devices and integrated circuit components having the functionality to receive paging messages and notify a user that such a message has been received. The process of placing the integrated circuits on PC board 202C is well-known in the art. Antenna 202B provides for reception of paging messages. Antenna 202B is not required if the card does not have to receive messages via wireless transmission.

In one embodiment, assembly 200 is coupled together using multiple pins, such as pins 206. The pins are inserted in holes, such as holes 205, in each of top 201, PC board assembly 202 and bottom 203, such that the pins wedge themselves within the holes. The holes are located near the sides of each of top 201, bottom 203, and PC board assembly 202. In one embodiment, each side includes three holes, such that each of top 201, bottom 203 and PC board assembly 202 includes six holes. Two of the three holes are located near the ends of the sides, while the third hole is positioned near the middle along the same side. The number and size of holes on each of top 201, bottom 203, and PC board assembly 203 may be varied. For instance, each side memory include 2, 3, 4, 5 holes or more. Furthermore, the sides do not have to have the same number of holes. For instance, one side of top 201 may have five holes, while the other side has three holes. The number of holes and their arrangement is dependent in one embodiment on the requirements on how securely fastened assembly 200 is to be. It should be noted that PC board assembly 202 includes holes and is a wider PC board than that of the prior art. This allows the holes to match up with the holes in top 201 and bottom 203. In other embodiments, PC board assembly 202 does not include holes and, therefore, is not required to be nearly as wide as top 201 and bottom 202. Thus, PC board assembly 202 does not have to be so wide. It should be noted that although PC board assembly 202 is wide, where assembly 202 is connected, PC board assembly 202 is not exposed, except for connector 202A. In this case, PC board 202A is confined within the IC card. In another embodiment, PC board 202A may be wide enough to form part of the outer frame of the IC card when assembly 200 is coupled together.

The holes in top 201 and bottom 203 do not have to extend entirely through the material. The holes may be only recessed portions in the inside part of top 201 and bottom 203, such that none of the pins are exposed when assembly 200 is coupled.

In one embodiment, the pins are press fit pins. Other types of pins may be used. These include hexogonal pins. The pins may be an integrated part of the cover 201 or bottom 203. In this case, the part having the pins would not include holes. Both top 201 and bottom 202 may contain some of the integrated pins. In another embodiment, PC board assembly 202 may include pins onto which bottom 203 and top 201 "snap". In another embodiment, top 201, bottom 203 and PC board assembly 202 may include holes and integrated pins in an arrangement that allows assembly to be securely fastened together.

In other embodiments, assembly 200 may be coupled using an adhesive, such as epoxy. Assembly 200 may also be coupled using ultrasonic bonding.

FIG. 2B illustrates the section side view of assembly 200. Referring to FIG. 2B, top 201 and bottom 203 are shown as having frames and integral covers. The frame portions may include the cover support pillars 204. Also shown is PC board assembly 202 having connector 202A, antenna 202B, and PC board 202C. It should be noted that the integrated circuit card of the present invention includes only three parts as opposed to the six parts used in the prior art, as shown in FIG. 1.

FIGS. 3A–3I and 4A–4I illustrate one embodiment of top 201 and bottom 203 respectively. FIG. 3A is one side view of top 201. FIG. 3B is the bottom view of top 201 (i.e., the interior portion once assembled). FIG. 3C is another side view of top 201. FIG. 3D illustrates a third side view of top 201. FIG. 3E illustrates a top view (i.e., the exposed portion once assembled). FIG. 3F is an expanded section of FIG. 3E. FIG. 3G is a section view of section B—B of FIG. 3B. FIG. 3H is a section view of section A—A of FIG. 3B. FIG. 3I is a section view of section C—C of FIG. 3B.

One embodiment of top 201 is shown according to the reference numerals in FIGS. 3A–3I and the dimensions specified in Table 1 below. Note that all of the dimensions are in inches.

TABLE 1

| FIG. No. | Reference No. | Dimension |
| --- | --- | --- |
| 3A | 301 | R.005 TYP |
|  | 302 | 1.754 |
|  | 303 | .084 |
|  | 304 | .042 |
| 3B | 305 | R.020 TYP |
|  | 306 | .01 |
|  | 307 | .129 |
|  | 308 | .116 |
|  | 309 | 1.758 |
|  | 310 | 2.048 |
|  | 311 | 1.490 |
|  | 312 | 2.940 |
|  | 313 | 3.240 |
|  | 314 | .272 |
| 3C | 315 | .055 |
|  | 361 | 1.886 |
| 3D | 316 | .122 |
|  | 317 | .098 |
|  | 318 | .065 |
|  | 319 | .026 |
| 3E | 320 | R.080 |
|  | 321 | R.020 |
|  | 322 | 2.126 |
|  | 323 | 1.890 |
|  | 324 | 2.48 |
|  | 325 | 3.370 |
|  | 326 | 2.000 |
|  | 327 | 1.890 |
|  | 328 | .565 |
|  | 329 | 1.315 |
|  | 330 | 2.065 |
|  | 331 | 2.815 |
|  | 360 | .060 |
| 3F | 332 | .010 TYP |
|  | 333 | .045 TYP |
|  | 334 | .015 TYP |
| 3G | 335 | .120 |
|  | 336 | .118 |
|  | 337 | .039 |
|  | 338 | .065 |
|  | 339 | .012 |
|  | 340 | .184 |
|  | 341 | .039 |
|  | 342 | .026 |
|  | 343 | .080 |
| 3H | 344 | .098 |
|  | 345 | .123 |
|  | 346 | .080 |
|  | 347 | .073 |
|  | 348 | .130 |
|  | 349 | .262 |
|  | 350 | .158 |

TABLE 1-continued

| FIG. No. | Reference No. | Dimension |
|---|---|---|
| | 351 | 1.490 |
| | 352 | .394 |
| | 353 | .025 |
| | 354 | .129 |
| | 355 | .265 |
| | 356 | .116 |
| | 357 | .030 |
| | 358 | .065 |
| | 359 | .053 |
| 3I | 362 | .098 |
| | 363 | .065 |
| | 364 | .025 |
| | 365 | .024 |
| | 366 | .163 |
| | 367 | .120 |
| | 368 | .118 |
| | 369 | .060 |
| | 370 | .030 |
| | 371 | .005 × .005 CHAM |

Referring to FIG. 3B, top 201 is shown without any cover support pillars. In this manner, top 201 may be used with all types of PC board assemblies, such as modems, facsimile, LAN, etc. Also note that top 201 includes five holes on each side for use in coupling the card assembly together. It should be noted that one hole on each side near the end of top 201 has a diameter different from the rest of the holes on its side. FIG. 3E illustrates a groved section for providing a non-smooth surface on the card to facilitate in the handling to the card.

Figure 4H:
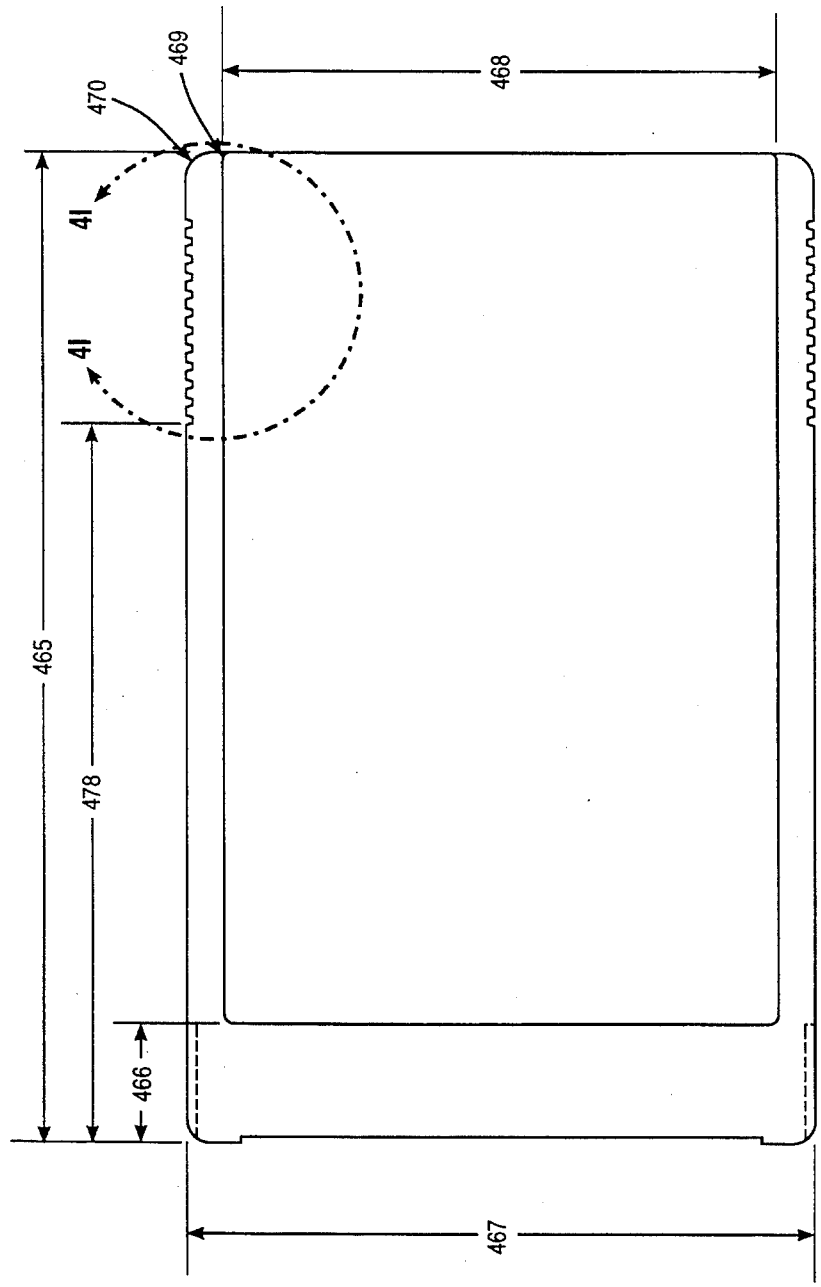

FIGS. 4A–4I illustrate one embodiment of bottom 203. FIG. 4E illustrates the inside portion of bottom 203 (i.e., the side that is interior to the card assembly when coupled together). FIG. 4A is a section view of section C—C of FIG. 4E. FIG. 4B is a section view of section B—B of FIG. 4E. FIG. 4C is section view of section A—A of FIGS. 4E. FIG. 4D is a side view of bottom 203. FIG. 4F is another side view of bottom 203. FIG. 4G is another side view of bottom 203. FIG. 4H is a view of the outer surface of bottom 203. FIG. 4I is an expanded view of a portion of FIG. 4H.

One embodiment of bottom 403 is shown using the reference numerals of FIGS. 4A–4I and their corresponding dimensions in Table 2.

TABLE 2

| FIG. No. | Reference No. | Dimension |
|---|---|---|
| 4A | 401 | .039 |
| | 402 | .118 |
| | 403 | .005 × .005 CHAM TYP |
| | 404 | .040 DIA |
| | 405 | .026 |
| | 406 | .050 |
| | 407 | .039 |
| | 482 | .026 |
| 4B | 408 | .098 |
| | 409 | .008 |
| | 410 | .163 |
| | 411 | .139 |
| | 412 | 1.539 |
| | 413 | 0.53 |
| | 414 | .043 |
| | 415 | 1.890 |
| | 416 | .060 DIA |
| | 417 | .118 |
| | 418 | .050 TYP |
| | 419 | .043 |
| | 420 | .065 |
| 4C | 421 | 2.080 |

TABLE 2-continued

| FIG. No. | Reference No. | Dimension |
|---|---|---|
| | 422 | 1.370 |
| | 423 | .585 |
| | 424 | .116 |
| | 425 | .043 |
| | 426 | .053 |
| | 427 | .025 |
| | 428 | |
| | 429 | .129 |
| | 430 | .610 |
| | 431 | .610 |
| | 432 | .008 |
| | 433 | .098 |
| | 434 | .008 |
| 4D | 435 | .055 |
| 4E | 436 | .608 |
| | 437 | .394 |
| | 438 | .129 |
| | 439 | .116 |
| | 440 | .025 |
| | 441 | .149 |
| | 442 | .380 |
| | 443 | .949 |
| | 444 | 1.758 |
| | 445 | 1.890 |
| | 446 | 2.048 |
| | 447 | .610 |
| | 448 | .585 |
| | 449 | .610 |
| | 450 | 1.370 |
| | 451 | 2.080 |
| | 452 | .610 |
| | 453 | .130 |
| | 454 | .008 |
| | 455 | R.055 TYP |
| | 456 | .735 |
| | 479 | .139 |
| | 480 | 1.539 |
| | 481 | 2.000 |
| 4F | 471 | R.005 TYP |
| | 472 | 1.754 |
| | 473 | .084 |
| | 474 | .042 |
| 4G | 457 | .060 |
| | 458 | .026 |
| | 459 | .065 |
| | 460 | .565 |
| | 461 | 1.315 |
| | 462 | 2.065 |
| | 463 | 2.815 |
| | 464 | .098 |
| 4H | 465 | 3.370 |
| | 466 | .394 |
| | 467 | 2.216 |
| | 468 | 1.890 |
| | 469 | R.020 |
| | 470 | R.080 |
| | 478 | 2.475 |
| 4I | 475 | .045 TYP |
| | 476 | .015 |
| | 477 | .010 TYP |

Referring to FIG. 4E, cover support pillars 204 are shown. Two of the three support pillars shown have the same dimensions (i.e., a square), while the third has different dimensions (i.e., a rectangle). FIG. 4G, as well as FIG. 4C, show bottom 203 having pins integrated into the cover/frame. These pins will be used to fasten top 201 and bottom 203 together when the card is assembled.

The present invention provides two framing pieces (top 201, bottom 203) having integral covers. Because the frame and cover are integrated together, the outer structure provides greater support and protection to the PC board components. When the board assembly is extended and includes pin holes aligned with those of the top and bottom sections, the overall structure of the IC card is even stronger and more rigid those IC cards in the prior art. Therefore, the present invention provides an IC card that has an improved outer frame structure.

The present invention is also advantages in its use of a non-conductive material for the outer structure. By using a molded plastic, such as glass filled polycarbonate, the outer structure of the IC card does not interfere with interior components, such as an antenna. It should be noted that in some embodiments, the side opposite to the antenna may be metal.

The outer structure of the IC card in the present invention is also less expensive than that of the prior art. Because the frame and cover are produced using a single mold, the IC card assembly is less expensive than stamping out a separate stainless steel cover and molding a lexan backfill section. Thus, the present invention provides for a less expensive IC card assembly.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

I claim:

1. A PCMCIA card for use in a computer system comprising:

a first rigid non-conductive cover having a first integrated frame portion, wherein the first cover is comprised of molded plastic;

a second rigid non-conductive cover having a second integrated second portion, wherein the second cover is comprised of molded plastic; and a board assembly having a plurality of electronic devices coupled together to provide a function, wherein the board assembly includes a PCMCIA 68-pin connector interface for coupling to the computer system to transfer signals between the computer system and the plurality of electronic devices, wherein the first cover and the second cover are bonded together, such that the first integrated frame portion and the second integrated frame portion form a rigidized frame around the board assembly to form a card architecture that adheres to the PCMCIA standard, and wherein the board assembly is contained within the first rigid cover and the second rigid cover, such that the PCMCIA 68-pin connector interface of the board assembly is exposed outside of the IC card, and further wherein the second rigid cover includes at least one support integrated therein to prevent depression between the second cover and the first cover to protect the plurality of electronic devices.

2. The card defined in claim 1 wherein the first cover includes at least one support to maintain the first cover in position with respect to the board assembly.

3. The card defined in claim 1 wherein the second cover includes a plurality of support walls to maintain the second cover in position with respect to the board assembly.

4. The card defined in claim 1 wherein said at least one support includes a support pillar.

5. The card defined in claim 1 wherein the first cover and the second cover are comprised of glass filled polycarbonate.

6. The card defined in claim 1 wherein the first cover and the second cover are coupled by a plurality of non-conductive pins.

7. The card defined in claim 6 wherein the plurality of non-conductive pins are integrated into the first cover and the second cover.

8. The card defined in claim 6 wherein the first cover and second cover include a first plurality of holes adapted for securing the non-conductive plurality of non-conductive pins, such that the first cover and the second cover remain coupled when each of the plurality of non-conductive pins is inserted into a distinct one of the plurality of holes in each of the first cover and the second cover.

9. The card defined in claim 6 wherein the board assembly includes a second plurality of holes aligned with the first plurality of holes, and wherein the first cover, second cover and the board assembly are coupled with the plurality of non-conductive pins.

10. The PCMCIA card defined in claim 1 or claim 6 wherein the plurality of electronic devices includes an antenna.

11. A PCMCIA card for use in a computer system comprising:

a first non-conductive cover having a first integrated frame portion, wherein the first cover comprises a glass filled polycarbonate material;

a second non-conductive cover with a second integrated frame portion, wherein the second cover comprises a glass filled polycarbonate material and includes a plurality of support pillars integrated into the second cover; and a board assembly having a plurality of electronic devices coupled together to provide at least one function, wherein the board assembly includes a PCMCIA interface for transferring signals between the computer system and the plurality of electronic devices, wherein the first cover and the second cover are bonded together, such that the first integrated frame portion and the second integrated frame portion create a rigidized frame around the board assembly to form a card architecture that adheres to the PCMCIA standard, and wherein the board assembly is contained within the first cover and the second cover, such that the PCMCIA interface of the board assembly is exposed outside of the IC card, and further wherein the plurality of support pillars prevent depression towards the board assembly in the IC card.

12. The PCMCIA card defined in claim 11 wherein the first cover includes a plurality of non-conductive pins integrated into the first integrated frame portion and the second cover includes a plurality of holes integrated into the second integrated frame portion for receiving the plurality of non-conductive pins.

13. The PCMCIA card defined in claim 12 wherein the first cover and second cover are ultrasonically bonded together, wherein ultrasonic bonds exist between the plurality of non-conductive pins and the plurality of pin holes.

14. The PCMCIA card defined in claim 11 or 12 wherein the plurality of electronic devices includes an antenna.

* * * * *